April 20, 1965 S. BERNFELD ET AL 3,179,902
CRYSTAL CONTROLLED TRANSISTOR OSCILLATOR
Filed Oct. 24, 1961
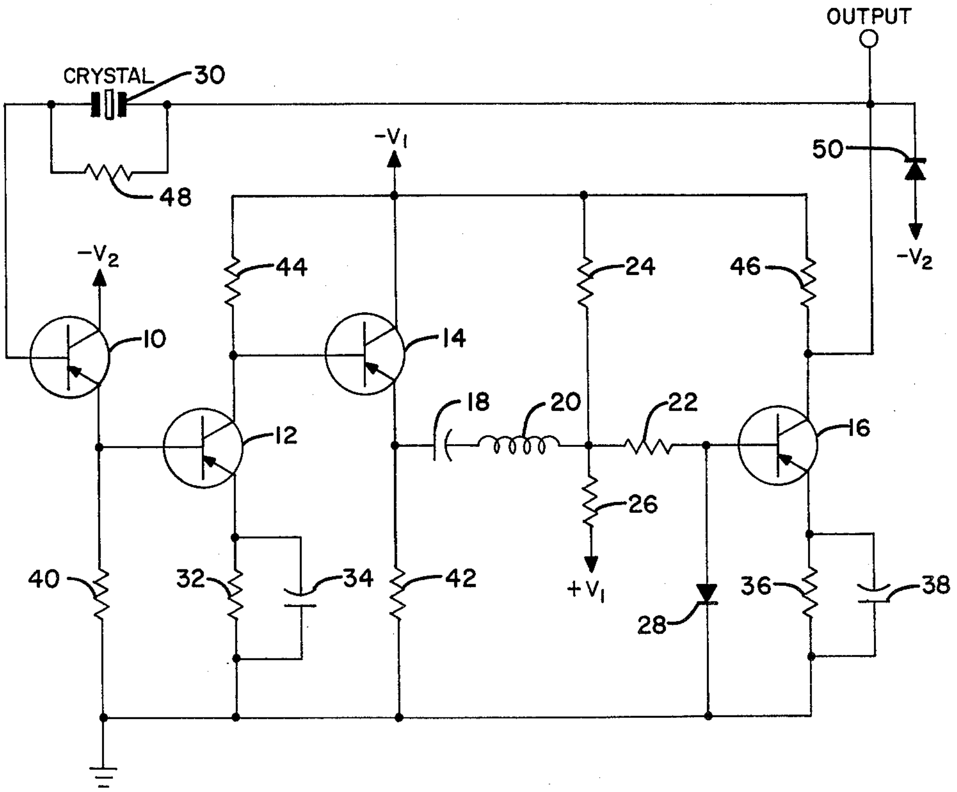
INVENTORS
SYLVAN BERNFELD
MAURITZ L. GRANBERG
HOWARD N. HANSON
JEROME J. STOFFEL
BY Marvin Jacobson
ATTORNEY United States Patent Office 3,179,902

Patented Apr. 20, 1965

3,179,902

CRYSTAL CONTROLLED TRANSISTOR OSCILLATOR

Sylvan Bernfeld, Shoreview, Mauritz L. Granberg, Richfield, Howard N. Hanson, Minneapolis, and Jerome J. Stoffel, Farmington, Minn., assignors to Sperry Rand Corporation, New York, N.Y., a corporation of Delaware Filed Oct. 24, 1961, Ser. No. 147,234
1 Claim. (Cl. 331—116)

This invention relates to transistor-oscillators in which the frequency of oscillation is controlled by a piezo-electric crystal.

In many electronic devices, it is important to maintain an accurate determination of time. For example, in a digital computer a real-time clock is required for periodically indicating the amount of time that has occurred in the course of functional operations. A typical use in a digital computer is to update data stored in the memory section of the computer every 60 seconds or a portion thereof and the real-time clock maintains an accurate record of the time interval. It is important that a high degree of accuracy of the real-time clock be maintained. In general an oscillator is utilized as the means for generating the basic timing signal. Because of their many advantages including low power requirements, small size and reliability, transistorized oscillators are often used as the circuitry to provide the basic timing signal. Furthermore piezo-electric crystals in the feedback path of a transistor oscillator are often used because of their reliability. It is commonly known that these crystals when held in a proper manner exhibit a natural frequency of oscillation which can be maintained by subjecting the crystal to an electrical signal of the proper phase relationship. In general, since the signal outputted by the oscillator is of a fixed frequency in order to determine the interval of time, the cycles of the oscillator output are counted. In a binary computer, counters comprising a multiplicity of bistable stages are used extensively and can be readily utilized to accurately record the real-time of an oscillator when the oscillator signal frequency is a power of 2. For example, an oscillator signal of a frequency equal to 4096 cycles per second can be fed into a binary counter which counts each cycle and when the 13th stage of the counter is set, this indicates that one second of time has occurred. In general, the signals applied to a binary counter must be of substantially square wave shape so as to selectively set and clear the various stages of the counter. Therefore, the shaping of the oscillator developed basic timing signal into a square wave form is required so preferably the oscillator circuitry should include means for shaping the signal into the desired form.

One disadvantage of using a crystal for controlling the oscillation is that even though the crystal has an inherent natural frequency of oscillation, its output includes signals of harmonic and subharmonic frequencies and will exhibit substantially the same series resonant characteristics at these frequencies as it does at its natural frequency.

Therefore, it is a general object of this invention to provide an improved crystal-controlled oscillator circuit.

It is a more specific object of this invention to provide a crystal-controlled oscillator which generates signals of substantially square wave shape.

Still a further object of this invention is to provide a circuit meeting the objective immediately above in which the frequency of the generated signal is stably maintained.

Briefly, the circuit of a preferred embodiment of this invention includes an input stage connected in an emitter-follower circuit configuration, an output stage, a crystal connected to couple part of the output signal from the output stage back to the input of the stage, a plurality of amplifying and shaping stages between the input and output stages including at least one additional transistor connected in the emitter-follower circuit configuration and a series inductance-capacitance-resistance circuit arranged to pass into the output stage only those signals of a frequency substantially equal to the natural frequency of oscillation of the crystal.

These and other more detailed and specific objects will be disclosed in the course of the following specification, reference being had to the accompanying drawing which shows the circuitry of an embodiment of this invention.

In the embodiment shown in the figure, the input stage comprises transistor 10 connected in the well known emitter-follower circuit configuration so that it presents a substantially large input impedance to any signal applied to the base electrode of the transistor. It has been found that the amount of current passing through a crystal, when utilized in the circuit configuration as shown in the figure, must be limited in order to prevent fracturing of the crystal and, therefore, the relatively large input impedance of the input stage provides the current limitation and minimizes the load on the crystal. The signal appearing on the emitter electrode of transistor 10 is substantially similar to the signal applied to its base since no phase reversal is effected by transistor 10. With the base of transistor 12 connected to the emitter of transistor 10, the signal applied to the base electrode of transistor 12 from the emitter of transistor 10 is amplified and inverted through transistor 12. The inversion is equivalent to 180° phase reversal through transistor 12. Due to the amplification by transistor 12, the output signal from transistor 12 appearing at its collector may be partially clipped. The base electrode of transistor 14 is connected to the collector of transistor 12. Transistor 14 is also connected in the emitter-follower configuration so that the signal appearing at its emitter resulting from the signal applied to the base from transistor 12 is in phase with the signal applied to its base. The emitter-follower configuration of transistor 14 presents a high impedance to the collector circuit of transistor 12 in order to minimize the loading effect of the former transistor on said collector circuit. Additionally, it further serves to minimize any possible increased load reflections back to the crystal through the input stage 10. The signal from the emitter electrode of transistor 14 is coupled to the base electrode of output transistor 16 via the series connected circuit including capacitor 18, inductor 20 and resistor 22. Actually, the resistance value of the series L-C-R circuit as seen by the signal appearing on the emitter element of transistor 14 is not strictly that of resistor 22 because of the parallel effect of resistors 24 and 26 and the added series resistance of the base-emitter resistance of transistor 16. Since the signal applied to the base of transistor 16 may be such as to drive transistor 16 alternatively between high and low levels of conduction, the base-emitter resistance changes as the conduction of transistor 16 changes. The series L–C–R circuit is tuned so that it, in conjunction with the additonal paralleling resistances, presents a relatively large impedance to all signals of frequencies other than those of a predetermined frequency. As will be explained subsequently in more detail this predetermined frequency is substantially equal to that of the natural frequency of oscillation of the piezo-electric crystal which provides the output-to-input feedback path for sustaining oscillations.

The diode 28 which is connected between the base electrode of transistor 16 and ground serves as a clipping diode to limit the magnitude of the positive signal applied to the base of transistor 16.

The signal applied to the base of the output transistor 16 from the emitter of transistor 14 via the L–C–R circuit is further amplified and inverted by transistor 16 so that the output signal on the collector of transistor 16 is substantially in phase with the input signal applied to the base of transistor 10. The negative excursion of the output signal at the collector of transistor 16 is limited by the clipping effect of diode 50. A piezo-electric crystal which has a natural frequency of oscillation is connected to the collector electrode of transistor 16 on one side and has its other side connected to the base electrode of the input transistor 10 to comprise a feedback path for at least a portion of the output signal. Resistance 48 is connected in parallel to crystal 30 to provide a damping action as an aid in preventing oscillations at harmonic frequencies of the crystal 30 fundamental frequency. In addition to the tuned circuits in the oscillator it has been found the cooperation of this resistance with such circuits provides an output signal always at the desired fundamental frequency. Resistance 30 further provides a bias to the base of transistor 10 and acts as an alternate path for providing drive signals from the transistor 16 collector to the transistor 10 base. If the crystal 30 is damaged so as to provide an open circuit, the oscillator will still operate close to the desired frequency due to the resistive coupling afforded by resistance 48. This arrangement provides certain advantages when it is desired to ensure the oscillator works at all times. Connected in this manner the crystal exhibits series resonance characteristics to signals of a frequency substantially equal to its natural frequency of oscillation to provide a relatively low impedance path for signals of that frequency which are coupled back from the collector of the output transistor 16 to the base of the input transistor 10. In this manner oscillations are sustained at the natural frequency of oscillation of the crystal.

The signals applied to the base electrode of transistor 10 by crystal 30 in response to the output signal applied thereto from the collector of transistor 16, because of the inherent characteristics of the crystal, contains harmonics and subharmonics of the natural frequency of oscillation of the crystal. Under some conditions it is possible that because of the closed loop effected by the feedback, sufficient build-up of signals of harmonic or subharmonic frequencies may be such as to cause the output signal to shift to a frequency equal to the harmonic or subharmonic of the natural frequency of oscillation of the crystal and thereby cause the dominant output signal to be that of the harmonic frequency. To inhibit the possibility of this occurrence, the previously described L–C–R circuit is turned so that in combination with other circuit impedances only signals of frequency substantially equal to that of the crystal are allowed to pass into the output stage from transistor 14. The L–C–R circuit therefore presents a relatively large impedance to signals of a frequency equal to harmonics or subharmonics of the natural frequency of the crystal while presenting a relatively low impedance to those signals of a frequency substantially equal to that of the natural frequency of the crystal. In this manner the harmonic and subharmonic frequencies are filtered out and are not allowed to pass into the input of the output stage so as to stabilize the frequency of the output signal at the natural frequency of oscillation of the crystal.

The R-C combination of resistor 32 and capacitor 34 in the emitter circuit of transistor 12 as well as the R-C combination of resistor 36 and capacitor 38 in the emitter circuit of transistor 16 serve to make the oscillator circuit shown in the figure self-starting in a well known manner.

The circuit of the shown embodiment was constructed with the following component values:

V1=15 volts
V2=3 volts
Resistor 22=390 ohms
Resistor 24=6.2K ohms
Resistor 26=7.5K ohms
Resistor 32=470 ohms
Resistor 36=180 ohms
Resistor 40=820 ohms
Resistor 42=2.4K ohms
Resistor 44=5.6K ohms
Resistor 46=5.6K ohms
Resistor 48=560K ohms
Capacitor 18=.022 mf.
Capacitor 34=10 mf.
Capacitor 38=10 mf.
Inductor 20=15 millihenries and crystal 30 having a natural frequency of oscillation of 4096 cycles per second. The circuit so constructed generated a square wave signal which swings between −0.5 volt and 3.3 volts at a frequency equal to 4096±.8 cycles per second over a wide temperature range. The circuit was designed such that the clipping action of diode 50 and the current saturation of transistor 16 was such to provide a square wave at the output. The feedback current traveling through the crystal 30 from the collector of the output transistor 16 to the base of the input transistor 10 was measured to be approximately 20 microamperes R.M.S. (root-mean-square).

It is understood that suitable modifications may be made in the structure as disclosed provided such modifications come within the spirit and scope of the appended claim. Having now, therefore, fully illustrated and described our invention, what we claim to be new and desire to protect by Letters Patent is:

A crystal control oscillator comprising:

(*a*) a first emitter-follower amplifier stage having an input and an output, (*b*) a first transistor amplifier stage having an input and an output with the input being connected to the output of said first emitter follower and the output being taken off the transistor collector electrode, (*c*) a second emitter-follower amplifier stage having an input and an output with its input connected to the output of the first transistor amplifier, (*d*) a filter comprising series connected capacitance, inductance and resistance and having an input and an output portion with the input portion being connected to the output of said second emitter-follower stage, (*e*) a second transistor amplifier stage having an output taken off its collector with its input connected to the output of said filter, (*f*) clamping diode means connected to the input of said second transistor amplifier for limiting the voltage at the input, (*g*) a piezo-electric crystal and a resistance connected in parallel circuit between the input of the first emitter-follower amplifier stage and the output of the second transistor amplifier stage for providing frequency selective feedback to permit oscillation of the circuit, (g-1) the circuit oscillating at a frequency close to the crystal frequency whenever the crystal is removed but oscillating at the crystal frequency whenever the crystal is connected, (h) diode clipping means connected to the output of the second transistor amplifier stage for limiting the voltage excursion in a first sense, (i) the bias to the first emitter-follower stage being provided through the crystal paralleled resistance from the output of the second amplifier stage, (j) and the gain of the circuit being such in combination with the clipping diode means to provide a square wave at the output of the second transistor amplifier.

References Cited by the Examiner

UNITED STATES PATENTS

| | | | |
|---|---|---|---|
| 2,553,366 | 5/51 | Fry | 331—159 |
| 2,925,561 | 2/60 | Macdonald | 331—158 |
| 2,981,899 | 4/61 | Hahnel | 331—159 |
| 3,026,487 | 3/62 | Walsh et al. | 331—116 |

FOREIGN PATENTS

| | | |
|---|---|---|
| 541,029 | 11/41 | Great Britain. |

ROY LAKE, *Primary Examiner.*

JOHN KOMINSKI, *Examiner.*